(12) United States Patent
Rau et al.

(10) Patent No.: US 7,029,808 B2
(45) Date of Patent: Apr. 18, 2006

(54) PHOTOSENSITIVE COATING MATERIAL FOR A SUBSTRATE AND PROCESS FOR EXPOSING THE COATED SUBSTRATE

(75) Inventors: Jenspeter Rau, München (DE); Siegfried Schwarzl, Neubiberg (DE); Stefan Wurm, Dublin, CA (US)

(73) Assignee: Infineon Technologies AG, Munich (DE)

( * ) Notice: Subject to any disclaimer, the term of this patent is extended or adjusted under 35 U.S.C. 154(b) by 192 days.

(21) Appl. No.: 10/673,964

(22) Filed: Sep. 29, 2003

(65) Prior Publication Data

US 2004/0115563 A1 Jun. 17, 2004

(30) Foreign Application Priority Data

Sep. 27, 2002 (DE) ................ 102 45 128

(51) Int. Cl.
 *G03C 5/02* (2006.01)
 *G03F 7/20* (2006.01)
 *G03F 7/039* (2006.01)

(52) U.S. Cl. ............. 430/30; 430/270.1; 430/327; 430/494; 430/914; 430/933; 396/210

(58) Field of Classification Search ............ 430/30, 430/270.1, 327, 494, 914, 933; 396/210
See application file for complete search history.

(56) References Cited

U.S. PATENT DOCUMENTS

| 6,017,677 | A  | * | 1/2000 | Maemoto et al. | ........ | 430/270.1 |
| 6,537,719 | B1 | * | 3/2003 | Takahashi | .................. | 430/191 |
| 6,566,030 | B1 | * | 5/2003 | Grober et al. | ............. | 430/139 |
| 6,770,407 | B1 | * | 8/2004 | Feke et al. | .................... | 430/30 |
| 6,864,024 | B1 | * | 3/2005 | Lyons et al. | ................... | 430/30 |

(Continued)

FOREIGN PATENT DOCUMENTS

DE 39 14 407 A1 10/1990

(Continued)

OTHER PUBLICATIONS

Julie L. P. Jessop et al.: "Characterizing Acid Mobility in Chemically Amplified Resists via Spectroscopic Methods", *Part of the SPIE Conference on Advances in Resist Technology and Processing XVI*, Santa Clara, CA, Mar. 1999, pp. 914-922.

(Continued)

*Primary Examiner*—Richard L. Schilling
(74) *Attorney, Agent, or Firm*—Laurence A. Greenberg; Werner H. Stemer; Ralph E. Locher

(57) ABSTRACT

A radiation-sensitive coating material, in addition to a base polymer, has a solvent and a radiation-active substance which forms an acid on irradiation by light (including energetic electrons or ions), a fluorescent substance which alters its fluorescence property subject to a change in the acid content of its surroundings. In a process for exposing a substrate coated with the coating material at least one sensor in the exposure chamber of the exposure apparatus measures the intensity of the change in fluorescence spectrum as a function of time during the exposure operation. From the course of intensity at the time of an individual line of the fluorescence spectrum or the intensity integrated over a wavelength interval it is possible to determine the endpoint of the exposure operation by way of electronic algorithms. Deviations from experimentally determined ideal curves of the intensity course provide information on erroneous functions in the course of coating material application and exposure.

3 Claims, 1 Drawing Sheet

U.S. PATENT DOCUMENTS

2002/0001768 A1* 1/2002 Feke et al. .................. 430/139
2002/0042019 A1  4/2002 Grober et al.

FOREIGN PATENT DOCUMENTS

| EP | 0 469 765 A1 | | 2/1992 |
|---|---|---|---|
| JP | 404213372 | * | 8/1992 |
| JP | 3507219 | * | 4/1997 |
| JP | 09219154 | * | 8/1997 |
| JP | 09319079 | * | 12/1997 |
| JP | 353045180 | * | 4/1998 |
| JP | 11338144 | * | 12/1999 |
| JP | 2003255543 | * | 9/2003 |

OTHER PUBLICATIONS

Prof. Dr. Jürgen Falbe et al. (ed.): "Römpp Chemie Lexikon" [RÖMPP Chemistry Dictionary], 9$^{th}$ ed., 1990, Georg Thieme Verlag, Stuttgart, Eintrag "Farbe" [listing color], pp. 1298-1300.

Plummer, J. D. et al.: "Silicon VLSI Technology", Prentice Hall Inc., 2000, pp. 221-226.

DeMent, J.: "Handbook of Chemistry and Physics", CRC Press, 55$^{th}$ Edition, 1974-1975, pp. D117-D118.

* cited by examiner

PHOTOSENSITIVE COATING MATERIAL FOR A SUBSTRATE AND PROCESS FOR EXPOSING THE COATED SUBSTRATE

BACKGROUND OF THE INVENTION

Field of the Invention

The present invention relates to a photosensitive coating material for coating a substrate and to a process for exposing the substrate coated with the photosensitive coating material. The invention relates in particular to a process for exposing a semiconductor wafer in a lithographic projection process.

In the fabrication of integrated circuits a lithographic projection process is used to transpose patterns from a mask onto a substrate: a semiconductor wafer or a flat panel, for instance. Transposition takes place into a layer comprising a photosensitive coating material (resist). After the exposed parts of the coating material (positive resist) have been developed and removed the patterned resist layer itself is utilized as a mask for transposing the pattern into an underlying layer by way, for example, of an etching process.

To transpose the mask pattern into the resist layer it is possible to use photon radiation or particle radiation. The wavelengths normally used in this case are located in the visible optical range, in the ultraviolet range (DUV, deep ultraviolet, and VUV, vacuum ultraviolet) or in the soft X-ray range, which is also called EUV (extreme ultraviolet). Exposure can also be carried out by particle lithography, an example of which is ion projection lithography (IPL). The use of electron beams (EBL), which is already known from mask exposure, is a further possibility. The particle energies or corpuscular wavelengths depend here on the acceleration voltages used, typically from 30 to 100 keV.

In the case of the positive resists whose use is presently preferred one requirement is to set the radiation dose for the exposure such that the pattern is transposed into the photosensitive layer true to scale and that the line profiles formed in the photosensitive layer following development exhibit a high steepness.

An inadequate exposure dose with beams or particles can lead to an incomplete removal of the resist in the exposed areas, so that in the case of the positive resist linear distances are formed with too small an extent, if at all. In the case of a subsequent etching operation, flat resist profiles can lead to an uncontrollable transposition of the pattern widths of lines.

This problem also occurs in the case of overexposure with too great an exposure dose, wherein case the exposed areas are undesirably widened.

The factors which determine an exposure dose include the following: the exposure power of the radiation, the exposure time, the thickness of the photosensitive layer, the chemical composition and sensitivity of the photosensitive layer, the optical properties of underlying layers, such as their reflectivity, for example, and also charging effects of the exposed patterns, etc.

Owing to the very low pattern widths to be achieved on the substrate it is generally insufficient to define theoretically the optimum exposure dose for true-to-scale imaging. A role is also played, for example, by problems such as nonuniform illumination of the exposure field as a result of deadjustment of the optical system or of the illuminator, deterioration in the optical or ion-optical components, fluctuations in the light source or particle source, external mechanical or electromagnetic interference, which in particular may also occur suddenly in each case. As regards the thickness of the photosensitive layer it is also possible for center/edge variations, caused during the spin coating of the photosensitive resist, or else for the underlying pattern topography to play a part. The chemical properties of the resist may likewise vary over time, so that two successive substrates to be exposed, with the same resist, are subject to different resist sensitivities. One example is the storage time of the resist-coated substrate, particularly in the case of chemically amplified resists (CARs).

For a batch of, say, 25 substrates it is therefore usual to select what is termed a precursor substrate and to expose and develop it with different exposure doses, known as the exposure scale. The exposed patterns are subsequently measured for their pattern width and compared with the respective target pattern width. The exposure dose allocated to the pattern with the greatest match is then used to expose the remaining 24 substrates of the batch.

A disadvantage with this process is that it is time-consuming and at the same time the capacity of the exposure apparatus in question is not being fully utilized to fabricate saleable end products. There is a consequent increase in the costs of fabricating a product. Furthermore, variations in the above-mentioned factors that occur during the production sequence of one batch or else of just a single substrate cannot be taken into account by altering the exposure dose accordingly.

More recently, therefore, exposure apparatus has been developed wherein at least the variations in exposure output caused by the exposure apparatus itself can be corrected by means of a measurement of precisely the output in the region of the substrate. Corresponding control mechanisms are made available via the actuation of shutters, diaphragms and/or the speed of the scanning platforms in the case of scanners.

Such control mechanisms can only be used, however, with exposure apparatus wherein the exposure operation is conducted in the visible optical range or in the ultraviolet range. In the case of extreme ultraviolet radiation (EUV) the beam splitters which couple out the light to be measured at the location of the substrate would no longer be transparent and would cause at least partial shading of the exposure field.

In that kind of exposure apparatus, therefore, the exposure output is measured at the location of the light source, and not the substrate, and is integrated over time to give an exposure dose. When a desired target level has been reached, exposure is ended by means of the control mechanisms. The fraction of radiation actually incident on the substrate is determined beforehand and later on is merely combined with the radiation dose determined at the location of the light source in the calculation of the exposure output actually determined.

This calculation does not take account of variations from material to material, or for a relatively short time period, as a result of further mirror elements between the light source and the substrate, as also the imaging optical system, the wavelength filters, the vacuum windows or the EUV reflection mask. Slower variations can again be calibrated out by means of precursors. Changes which occur over very short timescales, on the other hand, lead to erroneous exposures in the photosensitive layer on the substrate. The projection systems described at the outset with regard to particle lithography are subject to similar problems.

SUMMARY OF THE INVENTION

It is accordingly an object of the invention to provide a photosensitive lacquer, an exposure apparatus, and a process for exposing a substrate coated with the photosensitive coating material in the exposure apparatus which overcomes the above-mentioned disadvantages of the heretofore-known devices and methods of this general type and which renders it possible to adjust an exposure dose in such a way that patterns can be transposed true-to-scale into the photosensitive layer in a lithographic projection step.

With the foregoing and other objects in view there is provided, in accordance with the invention, a photosensitive coating material for coating a substrate, comprising:

a base polymer, a solvent, a photoactive substance that forms an acid upon irradiation with light; and a fluorescent substance surrounded by at least one material and having a fluorescence property, the fluorescence property of the fluorescent substance changing in dependence on an acid fraction present in the at least one material.

With the above and other objects in view there is also provided, in accordance with the invention, a process for exposing a substrate in an exposure apparatus, which comprises the steps of:

providing a substrate coated with the radiation-sensitive coating material as outlined above;

loading the substrate into an exposure apparatus having at least one first sensor for detecting light re-emitted by the fluorescent substance in the coating material within a first wavelength range;

starting a first exposure operation by projecting a pattern into the photosensitive layer;

firstly measuring a first intensity of light emitted by the fluorescent substance at a first point in time with the at least one first sensor;

at least once secondly measuring a second intensity of light emitted by the fluorescent substance at at least one second point in time, with the at least one first sensor;

comparing the first intensity with the second intensity; and ending the exposure operation in dependence on a comparison result of the comparing step.

In accordance with the present invention a photosensitive coating material for coating a substrate for conducting an exposure operation comprises a base polymer, a solvent, a photoactive substance, and a fluorescent substance. The light emitted by the fluorescent substance during an exposure operation can advantageously be analyzed in order to provide information on the progress of the exposure operation, as described in the following text:

The photoactive substance possesses the property of forming an acid on irradiation by light, for example, during an exposure operation. Optical photoresists used conventionally, but also those of the ultraviolet light range (DUV, VUV), such as the chemically amplified photoresists (CARs) used since recent times, comprise such photoactive substances wherein an acid is formed in this way.

In the case of the photoresists which operate in the visible optical and ultraviolet range this photoactive substance is, for example, diazonaphthoquinone, which on exposure to light in the presence of moisture ($H_2O$) is converted into an acid, namely the carboxylic acid. A photochemical reaction of this kind is advantageous, for example, at the wavelengths 436 nm (g-line) or 365 nm (i-line). The carboxylic acid liberated separates the matrix consisting of a novolak as base polymer, so that the regions of the resist that were previously exposed can now be removed in a developer step.

In the case of the chemically amplified photoresists the photoactive substance likewise brings about, in a photochemical reaction, the formation of an acid which acts catalytically to produce further acid molecules. This process, however, takes place only in a heating step downstream of exposure, the so-called post-exposure bake operation. Constituents of the polymer chains of the base polymer that were previously insoluble are converted into soluble components in a chain reaction in this operation. These resists, which are normally used at 248 nm (DUV) and 197 nm (VUV), can also be used successfully in EUV lithography.

In both cases the presence and the number of acid molecules formed locally constitute a measure of the progress of the exposure operation. One way to obtain information on this measure is—in accordance with the invention—to use at least one fluorescent substance whose fluorescence property depends on the fraction of acid formed at a particular moment in time. As exposure progresses, and hence as the acid content increases, there is a decrease in the absorption coefficient of the resist, so that increasing numbers of fluorescent molecules are excited and the fluorescence intensity rises. The light re-emitted by the fluorescent substance can be captured with a sensor and evaluated. The fluorescence property is reflected in the spectrum and/or in the intensity of the light re-emitted by the fluorescent substance.

As fluorescent substances it is possible in particular to use what are called fluorescence indicators, which exhibit defined changes in the emitted fluorescent radiation when the pH changes. Fluorescence indicators of this kind are known, for example, from "Handbook of Chemistry and Physics", 55th edition, 1974–1975, CRC Press, p. D-117–D-118, which provides in particular a table of fluorescent substances in particular for the titration of opaque, cloudy or highly colored solutions. From this mention may be made by way of example of benzoflavine, which at a pH of 1.7 and above has a spectral course which is assigned a color value "green", and which at a pH of from 1.7 to 0.3 has a spectral course which is assigned a color value "yellow". In other words, when there is a relatively high fraction of acid in the photosensitive coating material, the fluorescent emission spectrum in the course of exposure to light is shifted to longer wavelengths. The color change occurs at a particular pH, in this case 1.7.

If, then, the pH falls below a value which is dependent on the particular substance (in the above case, a pH of 1.7), there is, accordingly, a color change; the wavelength of the radiation emitted is altered. The intensity of the radiation emitted by the fluorescent substance increases in proportion with the amount of acid liberated during exposure and with the associated decreasing absorption of the resist and undergoes the transition to a saturation phase as soon as the photosensitive coating material is fully exposed.

By measuring the change in intensity of the emitted fluorescent radiation over time it is therefore possible to monitor the exposure operation in situ, thereby making it possible in accordance with the invention to recognize the endpoint of the exposure operation. The transition of the substantially proportional increase in intensity to the saturation phase corresponds precisely to this endpoint.

In the process of the invention, therefore, during the exposure operation in the exposure apparatus, one or more sensors are used to detect the light emitted by the fluorescent substance. These sensors are preferably arranged in the exposure chamber of an exposure apparatus.

Where the sensors cover only a limited wavelength range, it is preferred to use at least two sensors whose sensitive wavelength ranges are different. In this way it is possible to record at least a section of the spectrum of the emitted light, thereby allowing assignment to a pH on the basis, for example, of a table held in the measurement and evaluation unit.

Also envisaged is the combination of different fluorescent substances in the photosensitive coating material, in order to allow the pH to be determined over relatively wide ranges.

Instead of a particular threshold value for determining entry into the saturation phase it is also possible to analyze the course of the curve. In the first case the fraction of the area exposed would have to be related to the measured intensity. In the second case it would be possible, for example, to detect the inflection point of the curve as it entered the saturation phase.

The invention accordingly envisages using fluorescent substances which allow either the measurement of fluorescence intensities emitted proportionally to the pH or the determination merely of the color changes as a function of the acid fraction; in the first case all that is necessary is to determine the intensity of at least one wavelength range, while in the second case it is necessary to measure at least two wavelength ranges by means of sensors.

A further possibility is to use a fluorescent substance and to analyze its light without said property of dependence on the acid content of the surrounding material. Indeed, if exposure is carried out using a light beam which as time progresses generates an increasingly deeper exposure profile in the coating material, so that at the site of the exposure this coating material becomes more and more transparent for the fluorescence intensity, then here as well, on entry into saturation, the coating material can be assumed to undergo satisfactory full exposure. For this purpose it is preferred to utilize a second light source, by virtue of the process of the invention, in addition to the exposure beam for forming the pattern, in order to allow the fluorescent substance to be excited uniformly as time progresses.

Other features which are considered as characteristic for the invention are set forth in the appended claims.

Although the invention is illustrated and described herein as embodied in a photosensitive coating material for a substrate and process for exposing the coated substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
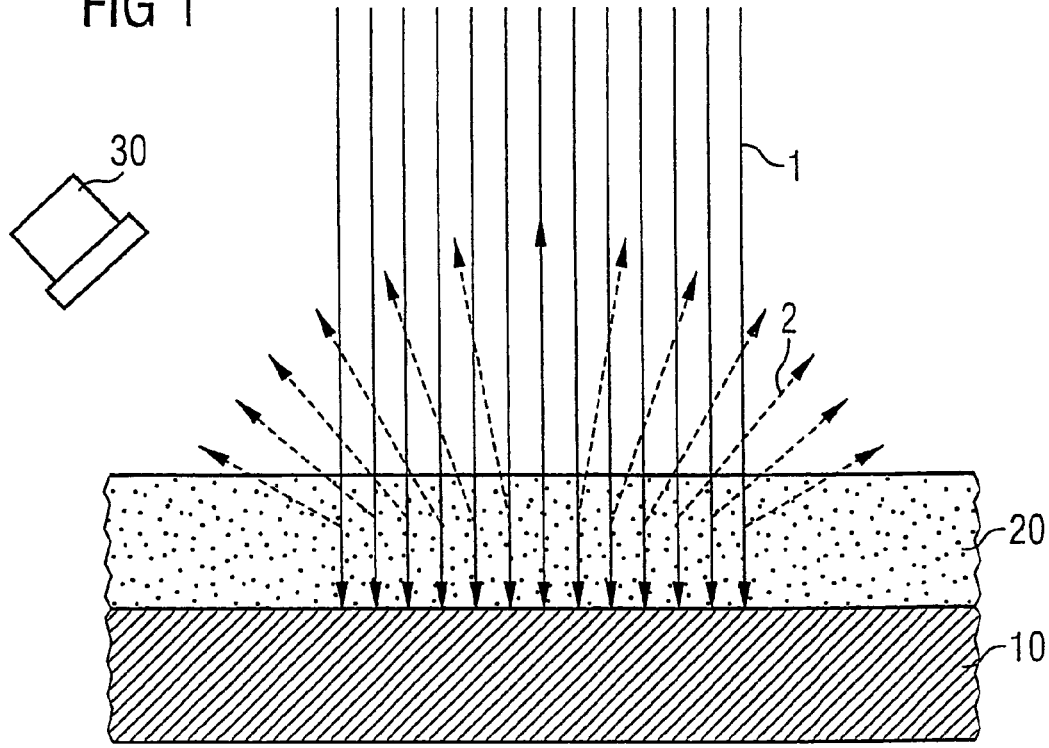
FIG. 1 is an elevational diagram showing an exemplary embodiment of a photosensitive coating material according to the present invention, which is exposed in an exposure apparatus.

Referring now to the figures of the drawing in detail and first, particularly, to FIG. 1 thereof, there is shown an exemplary embodiment of the present invention, in a diagrammatic illustration. A substrate 10—in this case a semiconductor wafer—is coated with a photosensitive resist 20. In the exemplary embodiment the exposure beam is an electron beam 1, which exposes a pattern in the photosensitive resist 20. The resist is sensitive to irradiation with electrons (and in this document is referred to as "photosensitive"). The semiconductor wafer 10 is first loaded into an exposure apparatus having an exposure chamber. The exposure chamber has a sensor 30 which is able to detect the intensity of emitted radiation in at least two wavelength ranges. The sensor system may also comprise a plurality of sensors 30, two for example, each of which is able to receive one wavelength range. The use of an optical grating with a diode array that covers the entire spectrum of interest with a corresponding wavelength range can likewise be realized.

Figure 2:
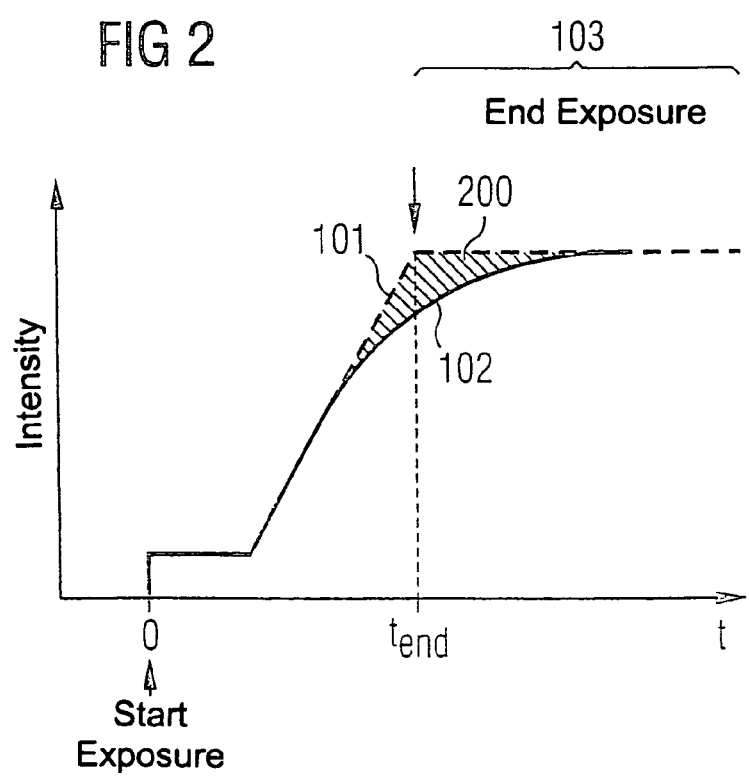
FIG. 2 is a graph plotting the time course of the intensity of the radiation re-emitted by the fluorescent substance in accordance with one exemplary embodiment of the process according to the invention.

With reference to FIG. 2, the exposure operation is started at a time t=0. At this point in time there are as yet no acid fractions in the photosensitive resist. The pH is approximately 7.0. As time progresses, acid groups are formed in a photochemical reaction, so that the pH falls. When a certain pH of, say, 6.4 is reached the color value of the spectrum of radiation emitted by the fluorescent substance begins to change. Whereas in the first wavelength range of the sensor 30 the intensity falls, the intensity in the second wavelength range begins to rise. FIG. 2 shows only the intensity course 101 of the second wavelength range. On reaching a pH of, say, 5.0 the photosensitive resist 20 is fully exposed. Acids can no longer be formed, so that in the time course a saturation profile is established.

When saturation has been achieved, i.e., when no further increase is found in the measured intensity, then in accordance with the process of the invention the exposure operation is ended as a reaction to this event. Further exposure would expose only adjacent resist areas and would lead to a deleterious widening of the line profile.

In accordance with the invention, however, the exposure operation can be ended before saturation is reached if the instantaneous color value and hence also the instantaneous pH is determined from the comparison of the measurements of the two sensors 30. If a predetermined target for the pH in this respect is known, then known control mechanisms can be used to advance a shutter or to switch off the light source when this target is reached. A prerequisite here is the holding of a table with an assignment of color value and wave-length.

If the course of an ideal intensity curve 101 is known, then from a number of individual measurements leading to a second intensity curve 102 (FIG. 2) it is possible to conclude the presence of further problem factors not associated with the variation of the light source over time. The size and shape of the area 200 in FIG. 2, as a measure of the distance to the ideal curve course 101, gives indications of whether, for example, there are inhomogeneities in the resist thickness, in the illumination of the exposure field, or in the under-lying pattern topography. In this case some areas of the resist will reach their saturation profile before other resist areas, so that the recorded saturation is established in a time interval which is dependent on the inhomogeneities.

Advantageously, by virtue of the present invention, the exposure doses can be set individually for each individual exposure field even within a substrate or semiconductor wafer in a manner optimized for a true-to-scale reproduction of image. The yield is thereby increased. Moreover, production costs are reduced, since there is no need to run precursor substrates. Where deviations from an experimentally determined ideal intensity curve 101 are ascertained in the course of exposure, an immediate apparatus monitoring operation can be initiated in reaction to the deviations found from a corresponding comparison of the curves, thereby preventing excessive production of reject products before the problem is ascertained in another way.

In the first exemplary embodiment, acid molecules are formed over the entire thickness range of the resist from time t=0, since the electron beam normally exhibits high depths of penetration. The increase in the intensity of the fluorescent light in one wave-length range, or the decrease in the other wavelength range, is therefore initially proportional to the progressing time.

In a second exemplary embodiment a laser beam is used for exposure at a wavelength of 365 nm. As time progresses an exposure profile is developed within the resist, since owing to absorption in the resist full exposure does not take place from the outset. In this case an idealized intensity curve may differ consider-ably from a linear correlation with time.

In the above examples the electron, ion or light beam used to expose the resist was also used to excite the fluorescent light. A further exemplary embodiment envisages installing a further illumination source which allows the color molecules formed by the electron, ion or light beam to be excited. The change in these fluorescence intensities over time as a function of the exposure dose reflects the status of the exposure operation. The further illumination source should in this case be provided in such a way that the resist itself is not impaired photochemically, i.e., exposed, something which can be realized by way of a suitable wavelength for the illumination source, differing considerably from 365 nm, for example.

We claim:

1. A process for exposing a substrate in an exposure apparatus, which comprises the steps of:
   providing a substrate coated with the radiation-sensitive coating material comprising:
   a base polymer;
   a solvent;
   a radiation-active substance forming an acid upon irradiation with energetic radiation; and
   a fluorescent substance having a fluorescence property, said fluorescent substance changing a fluorescence in dependence on an acid fraction present in a material surrounding said fluorescent substance;
   loading the substrate into an exposure apparatus having at least one first sensor for detecting light re-emitted by the fluorescent substance in the coating material within a first wavelength range;
   starting a first exposure operation by projecting a pattern into the photosensitive layer;
   firstly measuring a first intensity of light emitted by the fluorescent substance at a first point in time with the at least one first sensor;
   at least once secondly measuring a second intensity of light emitted by the fluorescent substance at at least one second point in time, with the at least one first sensor;
   comparing the first intensity with the second intensity; and
   ending the exposure operation in dependence on a comparison result of the comparing step.

2. A process for exposing a substrate in an exposure apparatus, which comprises the steps of:
   providing a substrate coated with the photosensitive coating material comprising:
   a base polymer;
   a solvent;
   a photoactive substance forming an acid upon irradiation with light; and
   a fluorescent substance surrounded by at least one material and having a fluorescence property, the fluorescence property of said fluorescent substance changing in dependence on an acid fraction present in said at least one material;
   loading the substrate into an exposure apparatus having at least one first sensor for detecting light re-emitted by the fluorescent substance in the photosensitive coating material within a first wavelength range;
   starting a first exposure operation by projecting a pattern into the photosensitive layer;
   firstly measuring a first intensity of light re-emitted by the fluorescent substance at a first point in time with the at least one first sensor;
   at least once secondly measuring a second intensity of light re-emitted by the fluorescent substance at at least one second point in time, with the at least one first sensor;
   comparing the first intensity with the second intensity; and
   ending the exposure operation in dependence on a comparison result of the comparing step.

3. The process according to claim 2, which comprises:
   providing the exposure apparatus with at least one second sensor for detecting the light re-emitted by the fluorescent substance within a second wavelength range;
   in the steps of the first measurement, detecting with the second sensor a third intensity of the radiation, and in the step of the at least one second measurement, detecting with the second sensor a fourth intensity of the radiation in the second wavelength range;
   determining, from a comparison of the first and the third intensity, a first color value of the re-emitted light at the first point in time;
   determining, from a comparison of the second intensity and the fourth intensity, a second color value of the re-emitted light at the second point in time;
   comparing the first color value and the second color value; and
   terminating the exposure in dependence on a comparison result in the comparing step.

* * * * *